United States Patent

[11] 3,626,302

[72] Inventors Hideo Nakamura;
Taiwa Okanobu, both of Tokyo, Japan

[21] Appl. No. 860,220
[22] Filed Sept. 23, 1969
[45] Patented Dec. 7, 1971

[73] Assignee Sony Corporation
Tokyo, Japan

[54] LOCAL OSCILLATOR RADIATION PREVENTING FREQUENCY CONVERTER CIRCUIT
4 Claims, 4 Drawing Figs.

[52] U.S. Cl. 325/436, 321/60, 325/318, 325/451, 325/483
[51] Int. Cl. H04b 1/12
[50] Field of Search 325/318, 319, 436, 451, 472, 483; 307/251, 304; 321/60, 65, 69 R; 332/52, 52 T

[56] References Cited

UNITED STATES PATENTS

| | | | |
|---|---|---|---|
| 3,130,370 | 4/1964 | Kondo et al. | 325/483 X |
| 3,332,022 | 7/1967 | Tongue | 325/436 X |
| 3,348,154 | 10/1967 | Fish, Jr. et al. | 325/451 |
| 3,348,155 | 10/1967 | Von Recklinghausen | 325/451 |
| 3,483,473 | 12/1969 | Lynk, Jr. et al. | 325/472 X |

*Primary Examiner*—Benedict V. Safourek
*Attorneys*—Lewis H. Eslinger, Alvin Sinderbrand and Curtis, Morris & Safford

ABSTRACT: A radio receiver having an improved signal to noise ratio and diminished cross modulation and interference wherein the local oscillator cooperates with a mixer circuit to change a radiofrequency signal selected by a tuning circuit into an intermediate frequency signal. The radio receiver utilizes a field effect transistor in the mixer circuit and only passive elements in the tuning circuit, and supplies the selected radiofrequency signal to the field effect transistor at the gate electrode, without preamplification of the radiofrequency signal. The output of the local oscillator is supplied to another terminal of the field effect transistor, namely the source electrode, in such a manner that the intermediate frequency signal appears at the drain electrode of the field effect transistor with improved signal to noise ratio and diminished cross modulation and interference. A balanced impedance bridge is associated with the field effect transistor and the local oscillator in order to prevent leakage to the antenna of the local oscillator signal and thereby avoid radiation of this signal by the antenna.

INVENTORS
HIDEO NAKAMURA
TAIWA OKANOBU
BY
ATTORNEY

INVENTORS
HIDEO NAKAMURA
TAIWA OKANOBA
BY
ATTORNEY

LOCAL OSCILLATOR RADIATION PREVENTING FREQUENCY CONVERTER CIRCUIT

The present invention relates to receivers and more particularly to radio receivers having improved signal-to-noise ratios and diminished cross modulation and interference.

When interference signals, such as are characterized by the term noise, are received with a desired information signal by a conventional radio receiver and nonlinear active elements, such as amplifying elements, are contained in the radio frequency conversion stages of the usual receiver, it is difficult to avoid cross modulation or spurious interference with the desired information signal. When these interference signals have high gain associated therewith, or are given high gain due to being passed through the radiofrequency amplifier circuit contained in the frequency conversion stages of the conventional radio receiver, the resulting large amount of interference produced in the desired information signal gives rise to an undesirable output signal having a poor signal to noise ratio. One way that has been tried to avoid the foregoing is to diminish the level of this interference signal before it is applied to active elements having nonlinear characteristics, and then, in subsequent stages, to only utilize active elements having linear characteristics. For example, it has been suggested to provide a radio receiver with a radiofrequency circuit having high selectivity and an active or amplifying element with good linearity and low amplification gain. However, satisfactory results have not been obtained in accordance with this suggestion. Another proposal for diminishing the undesirable effects of interference has consisted of eliminating the radiofrequency amplifier circuit and passing the input signals with low gain to the mixer circuit. However, there are disadvantages associated with this proposal in that the local oscillator signal, which is normally applied to the mixer circuit for purposes of frequency conversion, has a tendency to leak toward the antenna, where it is radiated from the antenna. This radiated local oscillator signal may interfere with other electrical devices within the radiation area of the antenna, such as, other radio or television receivers. Another disadvantage of the aforementioned prior proposals is that the signal to noise ratio and the sensitivity of the receiver deteriorate.

An object of this invention is to provide a new and improved radio receiver which overcomes the foregoing disadvantages of the prior art.

Another object of the present invention is to provide a new and improved radio receiver having improved signal-to-noise ratio and diminished cross modulation interference.

Still another object of the present invention is to provide a new and improved radio receiver having only passive elements in the tuning stage and no preamplification prior to the mixing stage.

A still further object of the present invention is to provide a new and improved radio receiver wherein antenna radiation of the local oscillator signals is prevented.

With these objects in view, in a radio receiver comprising tuning circuit means for selecting a desired radiofrequency signal from the signals received by an antenna, local oscillator means having an output at a frequency substantially different from the frequency of the radiofrequency signals selected by the tuning circuit means, and mixer circuit means for changing the radiofrequency signal into an intermediate frequency signal by means of the output of the local oscillator means; the mixer circuit means comprises a field effect transistor having gate, source, and drain electrodes, the tuning circuit means comprises only passive elements to supply the selected radiofrequency signal to the gate electrode without preamplification of the signal, and the output of the local oscillator means is applied to the source electrode so that the intermediate frequency signal appears at the drain electrode of the field effect transistor with improved signal-to-noise ratio and diminished cross modulation and interference.

The above, and other objects, features and advantages of the invention, will be apparent in the following detailed description of an illustrative embodiment which is to be read in connection with the accompanying drawings, wherein.

Figure 1:
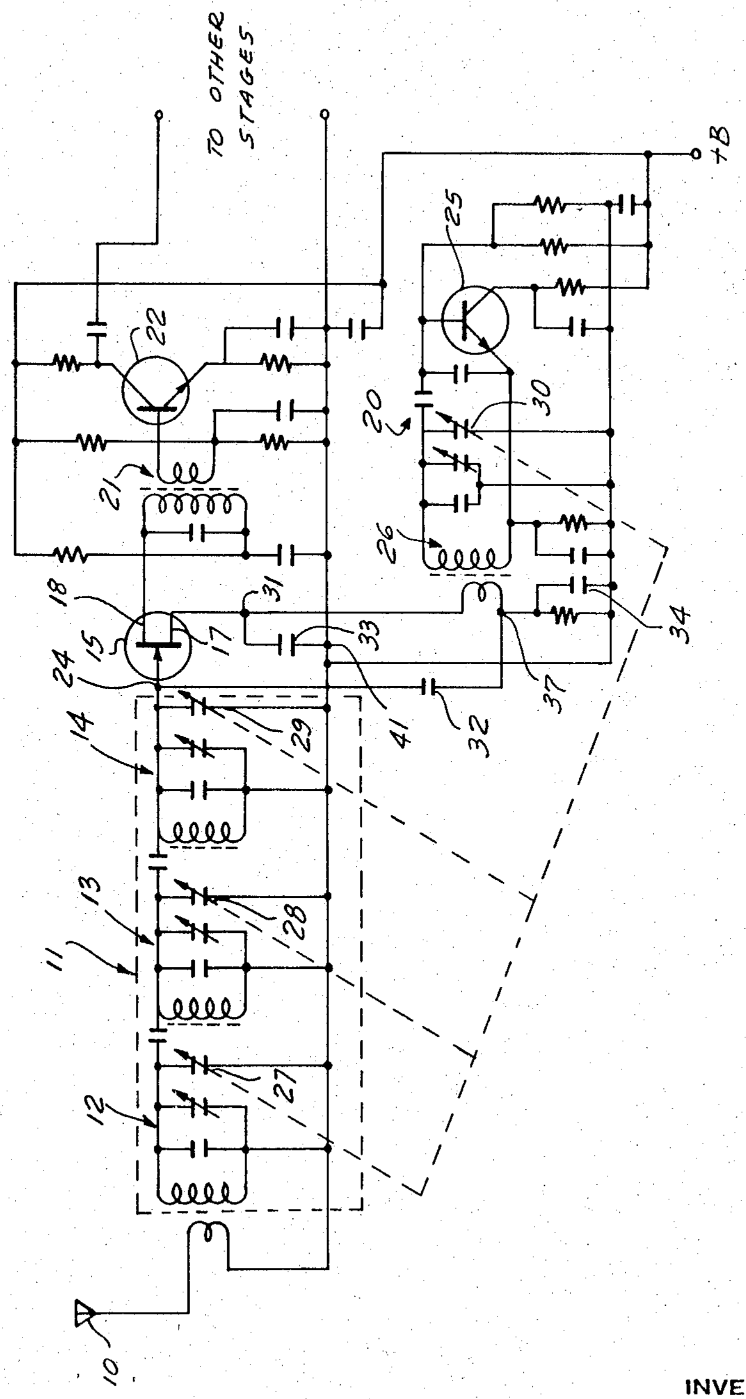
FIG. 1 is a schematic circuit diagram showing the frequency conversion stages of a radio receiver in accordance with this invention.

Referring now to FIG. 1, it will be seen that the front end or frequency conversion portion of a radio receiver in accordance with this invention, generally comprises a conventional antenna 10 for receiving radiofrequency signals, such as FM signals; a radiofrequency tuning circuit 11, which consists of a plurality of three resonance circuits, 12, 13, 14, connected in series; a mixer stage having a field effect transistor 15 having a gate electrode 16, source electrode 17 and drain electrode 18, and a local oscillator 20, and an intermediate frequency circuit having an IF transformer 21 and an IF amplifier 22. As shown, gate electrode 16 of field effect transistor 15 is connected to radiofrequency tuning circuit 11 at point 24 to receive the selected radiofrequency signal without preamplification. The local oscillator 20 may comprise a transistor 25 and a resonance circuit 26 for oscillation. Variable capacitors 27, 28 and 29 in the radiofrequency tuning circuits 12, 13 and 14 are ganged with a variable capacitor 30 in the local oscillator 20 so as to be simultaneously varied therewith.

As was previously mentioned, one input to the field effect transistor 15 of the mixer stage is the selected radiofrequency signal appearing at point 24. The other input to the field effect transistor 15, which is the signal to be mixed with the selected radiofrequency signal to obtain an intermediate frequency signal, is the local oscillator signal which is at a frequency substantially different from the frequency of the selected radiofrequency signal and is applied to field effect transistor 15 at the source electrode 17 through point 31. The output of the field effect transistor 15 is taken from the drain electrode 18 and fed to the intermediate frequency transformer 21 where it is then passed to the intermediate frequency amplifier 22 and on to the subsequent conventional stages of the radio receiver.

Figure 4:
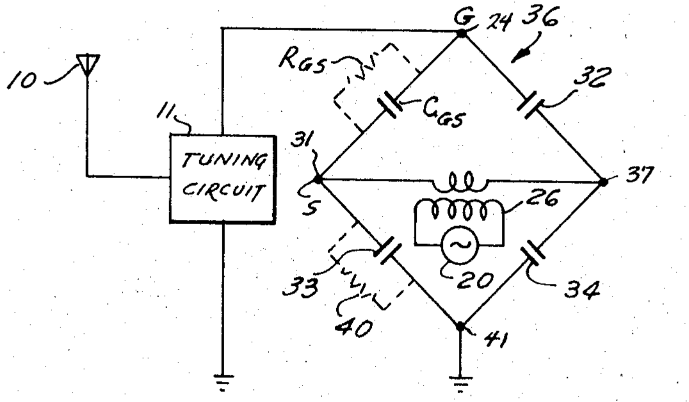
FIG. 4 is a schematic circuit diagram presenting a simplified equivalent of the mixer circuit shown in FIG. 3.

Capacitors 32, 33 and 34 are connected with the field effect transistor 15 to form a balanced impedance bridge 36, as is shown particularly on FIG. 4. The local oscillator 20 is connected across the impedance bridge 36 at points 31 and 37 (see FIG. 4). For purposes of illustration, the impedance characteristic of the field effect transistor 15 which is utilized in the balanced impedance bridge 36 is represented by the interelectrode capacitance $C_{gs}$ between the gate and source electrodes and is shown in one arm of the bridge, while the other impedance arms of the balanced impedance bridge 36 contain capacitors 32, 33 and 34, respectively. When the interelectrode resistance between the gate and source electrodes indicated at $R_{gs}$ is appreciable, a resistor 40, shown in broken lines on FIG. 4, is connected in parallel across the capacitor 33 so as to maintain the balanced condition of the bridge 36. In the normal case, when the interelectrode resistance $R_{gs}$ is not appreciable, resistor 40 may be omitted. The capacitors 32, 33 and 34 are chosen so as to maintain the bridge 36 in the balanced condition and conform to the expression $(C_{gs}) (C_{34}=(C_{32}) (C_{33})$. The impedance bridge 36 (see FIG. 4) will maintain a balanced condition and the voltage applied between the connecting points 31 and 37, which is the local oscillator output voltage, does not affect the voltage between the connecting point 24, which is the input from the radiofrequency tuning circuit 11, and point 41, which is ground. Therefore, the local oscillator signal applied between the connecting points 31 and 37 does not leak toward the gate electrode 16 through the equivalent capacitor $C_{gs}$ between the gate 16 and source 17 electrodes.

During operation of the radio receiver, the radiofrequency signal is received by the antenna 10 and is selected by the radiofrequency tuning circuit 11, which does not contain any active element having nonlinear characteristics so that no interference with the desired information signals, such as cross modulation or spurious interference, occurs in this circuit over a broad dynamic range of signals. Since the tuning circuit has a plurality of tuned resonance circuits connected in series, it has increased selectivity. The selected radiofrequency signal is applied, without preamplification, to the field effect transistor 15 comprising the mixer stage, through the gate electrode 16. Simultaneously with the reception of the selected radiofrequency signal, the local oscillator signal generated by local oscillator 20 is applied to the field effect transistor 15 through the source electrode 17. The radiofrequency signal undergoes frequency conversion and is converted into a mixed signal which is the intermediate frequency signal, and may be, for example, 10.7 megahertz. This intermediate frequency signal is fed to the intermediate frequency transformer 21 from the field effect transistor drain electrode 18 and is applied from transformer 21 to the intermediate frequency amplifier circuit 22 from where it is passed on to the other stages of the radio receiver.

The field effect transistor 15 which comprises the mixer stage of the radio receiver is an active element having a high input impedance, good signal to noise ratio, and good linearity in its transfer characteristics, which is the relationship between the gate and drain electrode currents. The input signal to the field effect transistor 15 does not have a relatively high gain due to the absence of a radiofrequency amplifier for preamplification of the input signal in the circuit of the present invention. This minimizes interference signals, such as cross modulation and spurious interference, and improves the signal-to-noise ratio of the radio receiver.

Figure 2:
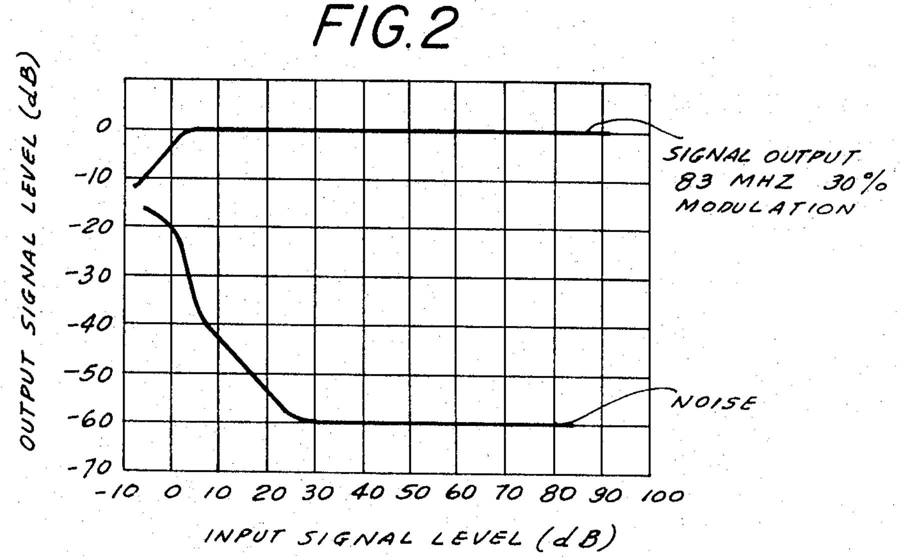
FIG. 2 is a graphical illustration of a characteristic of the receiver shown in FIG. 1.
Figure 3:
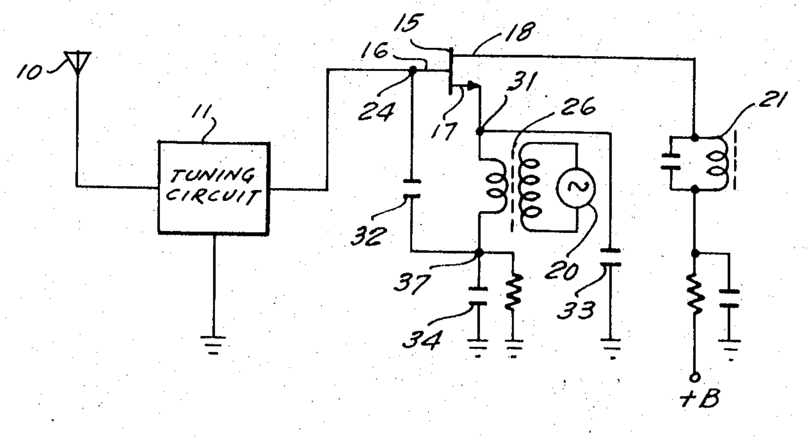
FIG. 3 is a partial schematic circuit diagram of the frequency conversion stages in FIG. 1, but with a simplified showing of the mixer circuit.

FIG. 2 shows the output signal and noise characteristic of a radio receiver having frequency conversion stage in accordance with this invention. By reference to the graphical illustration, it can be seen that a stabilized and high-quality signal can be obtained from a field effect transistor except in the case of very small level input signals. In the case of small level input signals, the local oscillator signal injected to the field effect transistor 15 of the mixer stage through the source electrode 17 would normally leak toward the radiofrequency tuning circuit N through the interelectrode impedance bridge between the gate and source electrodes 16 and 17 of the field effect transistor 15. Such leakage of the local oscillator signal would be subject to very little blockage and be radiated from the antenna 10 through the radiofrequency tuning circuit 11 as the radiofrequency tuning circuit does not contain any active element which could diminish the leakage local oscillator signal. This radiation of the leakage local oscillator signal, if allowed to occur, could cause interference to other radio or television receivers. In the case where the frequency of the local oscillator signal is selected to be higher than that of the selected radiofrequency signal, the radiofrequency tuning circuit 11 connected to the gate electrode 16 would have capacitive impedance for the local oscillator signal. Therefore, both the local oscillator signal applied to the source electrode 17 and the leakage oscillator signal would have the same phase, and, as a result, the effective applied voltage level of the local oscillator signal would be decreased. This decreased voltage level requires an increase in the voltage level of the local oscillator signal applied to the source electrode 17 in order to properly convert the frequency of the input signal to the intermediate frequency signal, and consequently, there is a further increase in the possibility of leakage of the local oscillator signal. However, the described impedance bridge 36, which has the field effect transistor 15 associated therewith, prevents leakage to the antenna of the local oscillator output signal applied to the source electrode 17 and, thereby, avoids radiation of the local oscillator leakage signal by the antenna 10.

With the circuit of the present invention, when a local oscillator signal of 1 volt is applied to the source electrode 17 of field effect transistor 15, the leakage local oscillator signal leaking toward the gate electrode 16 is less than 0.01 volts. This means that, with the circuit of the present invention, the leakage local oscillator signal is less than 1 percent of the applied local oscillator signal, and for all practical purposes, can be considered to be eliminated. By means of the use of a balanced impedance bridge circuit, having the field effect transistor 15 forming one of its arms, the leakage local oscillator signal is drastically diminished by means of a relatively simple circuit. When the frequency of the local oscillator signal is selected to be higher than that of the selected input radiofrequency signal, the effective applied voltage level of the local oscillator signal is so increased that the voltage level of the local oscillator signal applied to the field effect transistor 15 may be made lower than in a conventional type of radio receiver. This results in further diminishing the leakage local oscillator signal.

By utilizing the circuit of the present invention, a radio receiver having high quality, high sensitivity and excellent interference characteristics may be provided.

It is to be understood that the above-described embodiment of the invention is merely illustrative of the principles thereof and that numerous modifications and embodiments of the invention may be derived within the spirit and scope thereof.

What is claimed is:

1. A radio receiver comprising tuning circuit means for selecting a desired radiofrequency signal from the signals received by an antenna, local oscillator means having an output at a frequency substantially different from the frequency of said radiofrequency signal selected by said tuning circuit means, mixer circuit means for changing said radiofrequency signal into an intermediate frequency signal and which includes a balanced impedance bridge having a plurality of impedance arms and a field effect transistor having gate, source and drain electrodes and constituting one of said impedance arms between said gate and source electrodes, means for applying said selected radiofrequency from said tuning circuit means to said gate electrode, means for applying said output of the local oscillator means to said source electrode, and means operatively connecting said local oscillator means across said bridge so that the intermediate frequency signal appears at said drain electrode while leakage to the antenna of said local oscillator output is prevented and radiation of the local oscillator output by the antenna is avoided.

2. A radio receiver in accordance with claim 1, wherein said plurality of impedance arms comprises a first impedance arm which is said one impedance arm having the gate and source electrodes respectively as end points, a second impedance arm having end points connected to the source electrode end point and to ground respectively, a third impedance arm having end points connected to the ground end point and a common end point of a fourth impedance arm, and said fourth impedance arm has its other end point connected to the gate electrode end point; said local oscillator is operatively connected across the bridge at the source electrode end point and said common end point, respectively, whereby leakage of the local oscillator output signal from the source electrode to the gate electrode across the impedance associated therewith to the antenna is prevented.

3. A radio receiver in accordance with claim 2, wherein the impedance of each of said arms is at least the capacitive reactance of the respective arm.

4. A radio receiver in accordance with claim 1, in which said tuning circuit means includes a plurality of tuned resonance circuits connected in series to achieve high selectivity in respect of the desired radiofrequency signal.

* * * * *